Figure 1:
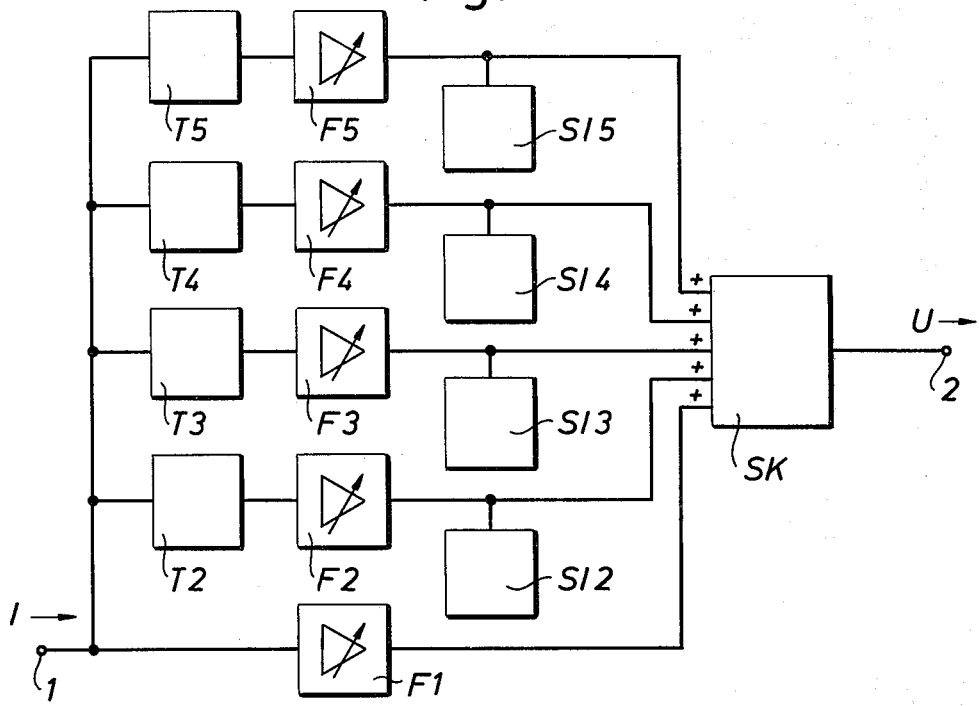

United States Patent [19]

Wegstedt

[11] 3,997,845
[45] Dec. 14, 1976

[54] DEVICE FOR MODIFYING AN ANALOG ELECTRIC SIGNAL

[75] Inventor: Lars Gunnar Wegstedt, Järfalla, Sweden

[73] Assignee: Servo Chem AB, Vallingby, Sweden

[22] Filed: Apr. 21, 1975

[21] Appl. No.: 570,074

[30] Foreign Application Priority Data
Apr. 25, 1974 Sweden .......................... 74056029

[52] U.S. Cl. .............................. 328/143; 328/156; 307/235 P
[51] Int. Cl.$^2$ ......................................... G06G 7/28
[58] Field of Search ................... 307/235 N, 235 P; 328/142, 143, 156

[56] References Cited
UNITED STATES PATENTS

| | | | |
|---|---|---|---|
| 2,831,107 | 4/1958 | Raymond et al. | 328/142 X |
| 2,899,550 | 8/1959 | Meissinger et al. | 328/143 |
| 3,228,002 | 1/1966 | Reines | 307/235 P |
| 3,736,515 | 5/1973 | Kadron et al. | 328/143 |
| 3,757,234 | 9/1973 | Ohlson | 328/142 |

Primary Examiner—John S. Heyman
Attorney, Agent, or Firm—Kenway & Jenney

[57] ABSTRACT

A device for modifying an analog electric signal and producing a modified analog electric signal being a pre-selectable non-linear function of the first signal comprises a plurality of amplifiers having individually variable gains. All amplifiers, possibly with exception for one amplifier, have their inputs connected to an input terminal for the signal to be modified through associated threshold circuits having individually variable threshold values, so that each amplifier operates only when the signal to be modified exceeds the threshold value of the associated threshold circuit and then provides an output signal proportional to the portion of the signal to be modified which lies above said threshold value. The output signals of the amplifiers operating at a given instant are combined into a combined signal constituting the desired modified analog signal. The device approximates the desired non-linear function between the original signal and the modified signal with a chain of successive straight line sections having different inclinations. The knee-points between these straight line sections in the approximation are selected by pre-setting the threshold values of the threshold circuits, whereas the inclinations of the straight line sections are selected by pre-setting the gain factors of the various amplifiers.

6 Claims, 5 Drawing Figures

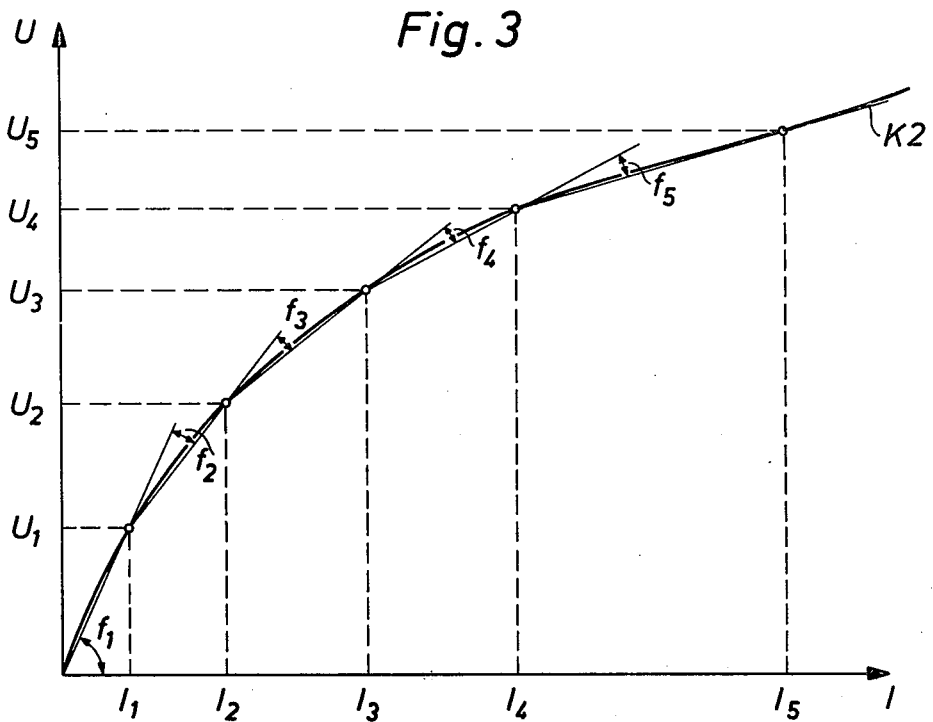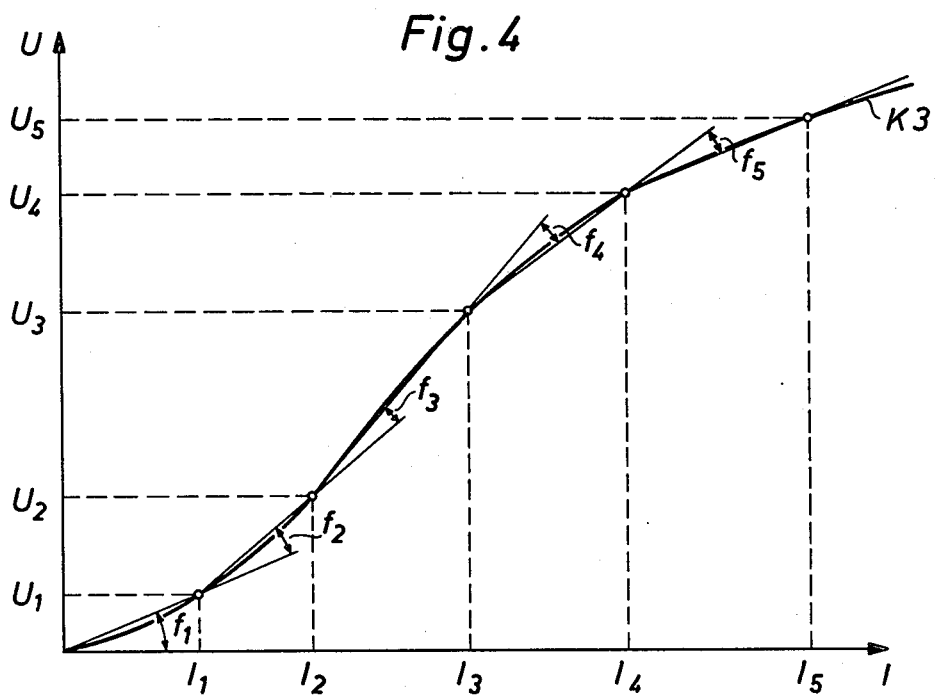

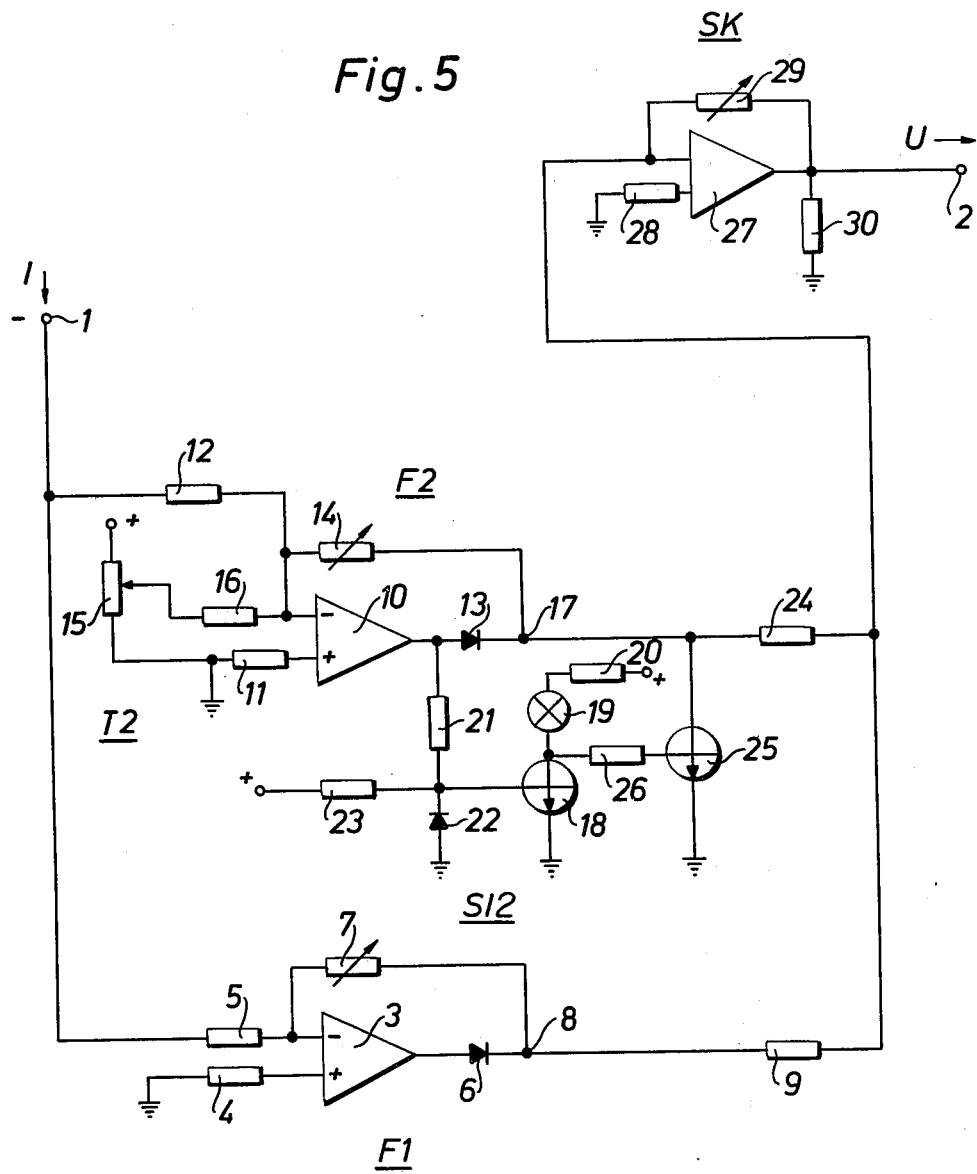

DEVICE FOR MODIFYING AN ANALOG ELECTRIC SIGNAL

The present invention is related to a device for modifying an analog electric signal and in particular a device which modifies an analog input signal and generates an analog output signal which is a predetermined non-linear function of the input signal.

A need for devices of this kind exists in many connections, as for instance within the measuring technique. Thus, within the measuring technique, it occurs in many cases that an analog electric measuring signal is produced, which is not directly linearly proportional to the value of the measured quantity. In such a case one wishes often to modify this measuring signal, before it is supplied to a recording or indicating instrument, in such a way that the signal supplied to the instrument is directly linearly proportional to the value of the measured quantity, whereby an instrument with a "linear" scale can be used. In other connections it may be desired to obtain a signal which is a predetermined exponential function of an already existing signal. This is the case, for instance, in connection with photometric measurements of the concentration of a given substance in a liquid sample. For such a photometric concentration measurement a beam of radiation of a predetermined wavelength is sent through the sample and the intensity of the radiation leaving the sample, the so called transmission, is measured by means of a radiation sensitive element, as for instance a photo diode. However, this measurement result, that is the transmission, is not directly linearly proportional to the concentration of the substance in the sample. Instead it is the so called extinction, that is the logarithm of the ratio between the intensity of the radiation leaving the sample and the intensity of the radiation entering the sample, which theoretically is linearly proportional to the concentration in the sample. However, this is true only in the ideal case, and in reality the non-linear relation between the transmission measured by the radiation sensitive element and the concentration in the sample depends on the substance for which the concentration is measured and also on the wavelength being used. Of course, the relation is also effected by any unlinearity of the radiation sensative element being used.

A signal modification of the kind discussed above can be obtained by means of a non-linear electric network, for instance consisting of diodes and resistors. As obvious from the foregoing, however, it is often desired that the signal modifying device can be adjusted or set to give different desired non-linear relation between the modified signal and the original input signal. Prior art devices for modifying an analog electric signal, which are adjustable or variable with respect to the nonlinear relation between the modified signal and the original input signal, are comparatively complicated in use. Above all it has been a time consuming operation to set or adjust these prior art devices to a predetermined desired non-linear relation between the modified signal and the original signal.

The object of the present invention is therefore to provide an improved device for modifying an analog input signal into an analog output signal being a given non-linear function of the input signal, which device can quickly and easily be adjusted or set to produce a given desired non-linear relation between an original input signal supplied to the device and the modified output signal from the device.

The device according to the invention for modifying an analog electric signal comprises a first amplifier and several additional amplifiers, all these amplifiers having individually variable gain factors, said first amplifier having its input connected to an input terminal for the analog signal to be modified, each of said additional amplifiers having its input connected to said input terminal through an associated threshold circuit having a variable threshold value so that the amplifier does not operate unless the value on the signal of said input terminal exceeds the prevailing threshold value of the threshold circuit, and being provided with an associated indicating means for indicating the state of operation of the amplifier, said first amplifier and each of said additional amplifiers having their outputs connected to signal combining means for combining the output signals of the amplifiers presently operating into a combined signal, which is supplied to an output terminal and constitutes the desired modified signal.

In a device according to the invention the curve or graph for the desired non-linear function between the original signal and the modified signal is approximated by a chain of successive, straight line sections with different inclinations. Each of these straight line sections is implemented by means of one of the amplifiers in the device according to the invention, wherefore the accuracy of the above approximation can be increased by increasing the number of amplifiers in the device. The starting point and the inclination of each straight line section can be individually varied and pre-set, wherefore the device can be quickly and easily adjusted to produce the desired non-linear relation between the input signal and the output signal. Further, a device according to the invention can be used whether the desired non-linear function between the modified signal and the original signal has a continuously increasing derivative, a continuously decreasing derivative or a derivative which sometimes decreases and sometimes increases.

Figure 2:
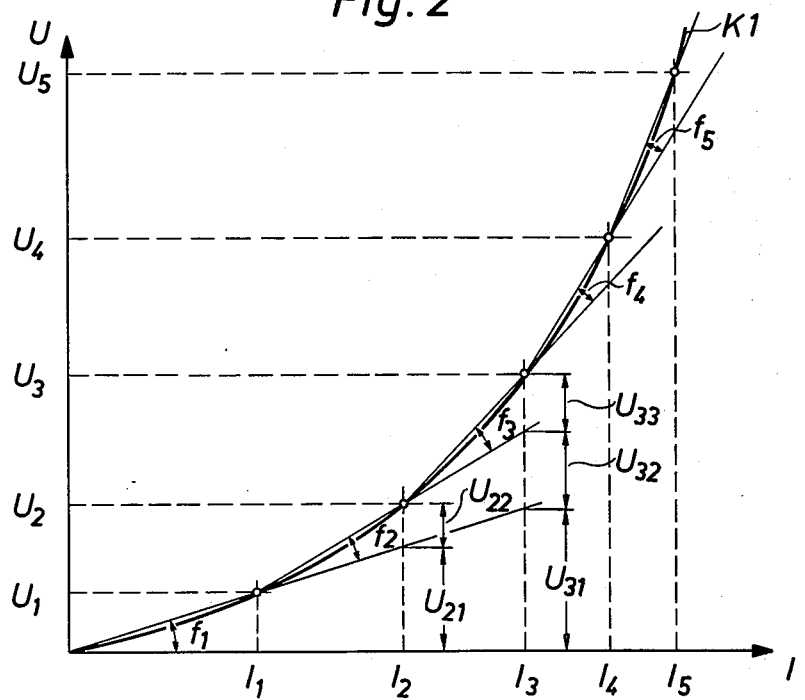

In the following the invention will be described more in detail with reference to the accompanying drawings, in which FIG. 1 is a block-diagram illustrating the fundamental design of a device according to the invention shown by way of example;

FIGS. 2, 3 and 4 are diagrams illustrating by way of examples some non-linear functions between the original signal and the modified signal which can be achieved wih the device in FIG. 1; and FIG. 5 is a more detailed circuit diagram illustrating by way of example a possible design of a device according to FIG. 1.

The device according to the invention shown schematically and by way of example in FIG. 1 has an input terminal 1 for the signal I to be modified and an output terminal 2 for the modified signal U. In the illustrated example the device comprises five amplifiers F1, F2, F3, F4 och F5 each having a variable gain. The first amplifier F1 has its input connected directly to the input terminal 1, whereas the remaining amplifiers F2 to F5 are connected to the input terminal 1 through individual threshold circuits T2, T3, T4 and T5, respectively. Each of these threshold circuits T2 to T5 has a variable threshold value and is designed to transfer to the associated amplifier F2 to F5 the portion of the input signal I on the input terminal 1, which lies above the set threshold value of the threshold circuit. Thus, each of the amplifiers F2 to F5 "operates" only when the signal I on the input terminal 1 exceeds the threshold value set in the threshold circuit T2 to T5 associated with the amplifier and will then amplify the portion of the signal I above said threshold value. Further, each of the amplifiers F2 to F5 is associated with a signal indicator SI2, SI3, SI4 and SI5, respectively, which in the illustrated example of the invention samples the signal on the output of the associated amplifier F2 to F5 and indicates, for instance visually, whether a signal is present on the output of the amplifier and thus whether the associated amplifier is "operating". The output signals of all amplifiers F1 to F5 are connected to a signal combining circuit SK, which in the illustrated example of the invention adds up the output signals of the amplifiers F1 to F5 and on the output terminal 2 provides an output signal U corresponding to the sum of the output signals of the amplifiers F1 to F5.

The pre-setting or pre-adjusting and the mode of operation of the device according to the invention shown by way of example in FIG. 1 shall be described more in detail in conjunction with FIG. 2. The diagram in FIG. 2 shows by way of example a desired non-linear relation or function, represented by the curve K1, between the analog signal I connected to the input terminal 1 and the modified signal U provied on the output terminal 2. In the device illustrated in FIG. 1 this non-linear function K1 is implemented by pre-adjustment or pre-setting of the gain factors of the amplifiers F1 to F5 and the threshold values of the threshold circuits T2 to T5. This adjustment or setting is made in the following manner. To begin with an input signal I having for instance the value $I_1$ (compare FIG. 2) is applied to the input terminal 1. Further, the threshold circuits T2 to T5 are set on threshold values sufficiently high so that none of the amplifiers F2 to F5 operates. Preferably the threshold circuits T2 to T5 are initially set on threshold values above the possible range of variation for the input signal I. With the input signal $I_1$ applied to the input terminal 1 the gain $f_1$ of the amplifier F1 is adjusted to such a value that the signal U on the output terminal 2 assumes the desired corresponding value $U_1$ (compare FIG. 2). Thereafter and with the signal $I_1$ still applied to the input terminal 1 the threshold circuit for one of the remaining amplifiers, for instance the threshold circuit T2 for the amplifier F2, is set on such a threshold value that the associated amplifier F2 just starts to "operate", which is indicated by the associated signal indicator SI2. It is appreciated that in the illustrated example the threshold circuit T2 is than set on the threshold value $I_1$. Thereafter the value of the input signal I on the input terminal 1 is increased for instance to $I_2$ (compare FIG. 2) and the gain $f_2$ of the amplifier F2 is adjusted until the signal U on the output terminal 2 assumes the desired corresponding value $U_2$ (compare FIG. 2). To this output signal $U_2$ the amplifier F1 contributes obviously the portion $U_{21}$, whereas the amplifier F2 contributes the portion $U_{22}$ (compare FIG. 2). While maintaining the signal value $I_2$ on the input terminal 1 the threshold circuit T3 for the next amplifier F3 is adjusted to the threshold value $U_2$ so that the amplifier F3 just starts to operate, which is indicated by the associated signal indicator SI3. Thereafter the value of the input signal I is increased for instance to $I_3$ (compare FIG. 2) and the gain $f_3$ of the amplifier F3 is adjusted to such a value that the output signal U of the output terminal 2 assumes the desired corresponding value $U_3$ (compare FIG. 2). To this output signal $U_3$ the amplifier F1 contributes the portion $U_{31}$, the amplifier F2 the portion $U_{32}$ and the amplifier F3 the portion $U_{33}$ (compare FIG. 2).

One continues in the manner described above by adjusting the threshold circuit T4 to the threshold value $U_3$ with the input signal $I_3$ connected to the input terminal 1, by setting the gain $f_4$ of the amplifier F4 and the threshold value $U_4$ of the threshold circuit T5 with an input signal $I_4$ connected to the input terminal 1, and finally by setting the gain $f_5$ of the amplifier F5 with an input signal $I_5$ connected to the input terminal 1, as illustrated in FIG. 2.

When pre-set in this way, the device in FIG. 1 approximates the desired non-linear function K1 with five straight line sections having the knee-points $I_1/U_1$, $I_2/U_2$, $I_3/U_3$ and $I_4/U_4$, respectively and the inclinations $(f_1+f_2)$, $(f_1+f_3)$, $(f_1+f_2+f_3+f_4)$ and $(f_1+f_2+f_3+f_4+f_5)$, respectively. It is appreciated that the positions of the knee-points between the straight line sections as well as the inclinations of these straight line sections can be selected at will for the best adaptation to the desired curve K1.

It is also appreciated that a still better adaptation or agreement to the desired curve K1 can be obtained by increasing the number of amplifiers in the device according to the invention, whereby the number of straight line sections in the approximation is increased correspondingly.

In the foregoing it was assumed that the signal combining circuit SK in the device according to the invention illustrated in FIG. 1 was designed to add up the output signals from all amplifiers F1 to F5, and this is preferable for a non-linearfunction between the output signal U and the input signal 1, which has continuously increasing derivative, as for instance the function illustrated by the curve K1 in FIG. 2. However, by means of a device according to the invention it is also possible to implement a non-linear function between the output signal U and the input signal I, which has a continuously decreasing derivative, that is a non-linear function of the type illustrated by the curve K2 in the diagram in FIG. 3.

As obvious from FIG. 3 and the description above, such a relation between the output signal U and the input signal I is obtained, if the signal combining circuit SK in the device according to the invention illustrated in FIG. 1 is designed to subtract the output signals of the amplifiers F2 to F5 from the output signal of the amplifier F1. This can be achieved by a suitable design of the signal combining circuit SK itself or alternatively by designing the amplifiers F2 to F5 to provide output signals with the opposite polarity relative to the output signal of the amplifier F1.

By means of a device according to the invention it is also possible to implement a non-linear function between the output signal U and input signal I having a derivative which sometimes increases and sometimes decreases, that is for instance a function represented by a double-curved graph of the kind illustrated for instance by the curve K3 in FIG. 4. It is appreciated that this can be achieved in that the output signal from some of the amplifiers F2 to F5 are added to the output signal of the first amplifier F1, whereas the output signals from other amplifiers F2 to F5 are subtracted from the output signal of the first amplifier F1. Thus, in the example illustrated in FIG. 4 the output signals of the amplifiers F2 and F3 shall be added to the output signal of the amplifier F1, whereas the output signals of the amplifiers F4 and F5 shall be subtracted from the output signal of the amplifier F1. In the practice this can be achieved in that the signal combining network SK is designed to have a first set of input terminals for signal addition and a second set of input terminals for signal subtraction, to which two sets of input terminals the outputs of the amplifiers F2 to F5 can be connected as required, or alternatively in that the device comprises some amplifiers producing output signals with the same polarity as the first amplifier F1 and some amplifiers providing output signals with the opposite polarity relative the first amplifier F1, in which case amplifiers are selected from these two groups of amplifiers as required.

It is appreciated that in a device according to the invention it may not always be necessary to use all the amplifiers included in the device. As mentioned in the foregoing, the number of amplifiers actually used is determined by the desired accuracy of the approximation to the desired non-linear function between the output signal and the input signal.

Although in the device according to the invention illustrated by way of example in FIG. 1 and described in the foregoing the first amplifier F1 has its input connected directly to the input terminal 1 for the signal I, whereby this first amplifier F1 will start to operate as soon as any signal is present on the input terminal 1, it is appreciated that it is also possible according to the invention that also the first amplifier F1 is connected to the input terminal 1 through an associated threshold circuit having an individually variable threshold value. Such a modified device according to the invention may have the advantage that it is possible to pre-set also the value of the signal I at which the first amplifier F1 starts to operate. In this way it is achieved that the device will not start to operate and produce the modified output signal U until the input signal I exceeds a given desired, pre-set value. In such a device according to the invention also the amplifier F1 should of course be provided with an associated signal indicator which indicates whether the amplifier F1 is operating.

FIG. 5 shows by way of example the circuit diagram of a practical design of the device according to the invention illustrated in FIG. 1 and described in the foregoing. However, FIG. 5 shows only the circuits for the amplifier F1, the threshold circuit T2, and the amplifier F2, the signal indicator SI2 and the signal combining circuit SK, as the additional threshold circuits T3 to T5, amplifiers F3 to F5 and signal indicators SI3 to SI5 can be designed in exactly the same way as the threshold circuit T2, and amplifier F2 and the signal indicator SI2, respectively.

The circuits shown by way of example in FIG. 5 are designed for a negative input signal I on the input terminal 1. The amplifier F1 consists of a differential amplifier 3 having its one input connected to ground through a resistor 4 and its second input connected to the input terminal 1 through a resistor 5. The output of the amplifier 3 is connected to a diode 6 and a feedback loop is provided from the output of the amplifier to its input through a variable resistor 7. When the signal I on the input terminal 1 is positive, the differential amplifier 3 provides a negative signal on its output, wherefore the feedback loop through the resistor 7 is interrupted by the diode 6. This means on the one hand that the differential amplifier 3 is saturated in said direction (with a negative output signal) and on the other hand that no signal is present in point 8 which constitutes the output of the amplifier circuit F1. If, on the contrary, the signal I on the input terminal 1 is negative, the differential amplifier 3 provides a positive signal on its output, wherefore the feedback loop through the resistor 7 functions and the amplifier circuit F1 provides a signal in point 8 proportional to the input signal, the gain factor being determined by the value of the variable resistor 7 in the feedback loop. This output signal is connected through a resistor 9 to the signal combining circuit SK, which will be described more in detail in the following.

The amplifier F2 is designed fundamentally in the same manner as the amplifier F1 and comprises consequently a differential amplifier 10 having its positive input connected to ground through a resistor 11 and its negative input connected to the input terminal 1 through a resistor 12. The output on the differential amplifier 10 is connected to a diode 13 and a feedback loop is provided through a variable resistor 14 to the negative input of the amplifier 10. If the signal on the negative input of the differential amplifier 10 is positive, the differential amplifier 10 provides a negative signal on its output and is saturated in this direction, as the diode 13 interrupts the feedback loop through the resistor 14. The positive signal will be present on the negative input of the differential amplifier 10 so long as the negative signal I on the input terminal 1 has a smaller value than that determined by the threshold circuit T2, which consists of a potentiometer 15 which is inserted between a fixed positive voltage and ground and which has its movable tap connected to the negative input of the differential amplifier 10 through a resistor 16. The threshold value of the threshold circuit T2 is consequently set by means of the potentiometer 15. As soon as the negative signal I on the input terminal 1 balances and exceeds the positive potential determined by the setting of the potentiometer 15, the negative input of the differential amplifier 10 will become negative and the differential amplifier 10 will provide a positive signal on its output, which positive signal passes through the diode 13 so that the feedback loop through the resistor 14 can function. In this condition there is provided in point 17, which constitutes the output of the amplifier circuit F2, a signal proportional to the signal on the negative input of the differential amplifier 10, the gain factor being determined by the value of the variable resistor 14.

The fact that the amplifier F2 is operating, that is that the threshold value set on the potentiometer 15 has been exceeded, is indicated by means of a signal indicator SI2. This comprises a transistor 18 having its collector-emitter path connected between ground and a positive potential in series with an indicator lamp 19 and a resistor 20. The base of the resistor 18 is connected to the output of the differential amplifier 10 through the resistor 21, to ground through a diode 22 and to a fixed positive potential through a resistor 23. As long as a negative voltage is present on the output of the differential amplifier 10, i.e. as long as the signal I on the input terminal 1 does not exceed the threshold value set on the potentiometer 15, the transistor 18 is non-conducting as its base is short-circuited to ground through the diode 22. Consequently, the lamp 19 is turned off. As soon as the amplifier circuit F2 starts to "operate" in the manner described above so that a positive voltage is provided on the output of the differential amplifier 10, the transistor 18 will conduct, whereby the lamp 19 lights up to indicate that the amplifier circuit F2 has started to operate, i.e. that the signal I on the input terminal 1 balances the threshold value set on the potentiometer 15. The output signal on the output 17 of the amplifier circuit F2 is connected to the signal combining circuit SK through a resistor 24.

A transistor 25 has its emitter-collector path connected between point 17 and ground. The base of this transistor 25 is connected to the collector of the transistor 18 through a resistor 26. It is realised that this transistor 25 conducts and shortcircuits point 17 to ground, when the transistor 18 is non-conducting, i.e. when the amplifier circuit F2 is non-operating. The purpose of the transistor 25 is only to maintain the output 17 of the amplifier circuit F2 on a fixed potential (ground potential) when the amplifier circuit F2 is non-operating so that under this condition the signal combining circuit SK can not be affected by any random signal from the amplifier circuit F2. When the amplifier circuit F2 operates and thus the transistor 18 is conducting, the transistor 25 is non-conducting.

In the illustrated example the signal combining circuit SK consists of a differential amplifier 27 having its one input connected to ground through a resistor 28 and its second input connected to receive the output signals from the amplifier circuits F1 and F2 through the resistors 9 and 24, respectively. The differential amplifier 27 is also provided with a feedback loop through a variable feedback resistor 29. The output terminal 2 is connected to the output of the differential amplifier 27, which is also connected to ground through a resistor 30. The feedback of the amplifier 27 is set on such a value that the amplifier keeps the voltage on its upper input to zero, which means that the output voltages of the amplifiers F1 and F2 provide proportional corresponding currents through the resistors 8 and 24, respectively, which currents are added on the input of the differential amplifiers 27. Consequently, the amplifier 27 provides an output voltage U on its output, which is directly proportional to the sum of the output voltages of the amplifier circuits F1 and F2.

It is appreciated that instead of the circuits shown by way of example in FIG. 5 and described above, also various other circuit designs may be used for a device according to the invention.

I claim:
1. A device for modifying an analog electric input signal and providing an analog electric output signal being a preselectable non-linear function of the input signal, comprising a first amplifier circuit and a plurality of additional amplifier circuits, each of said first and additional amplifier circuits having an input terminal and an output terminal and an individually variable gain factor and being operative to provide on said output terminal a signal proportional to the product of said gain factor and a signal present on said input terminal, when the signal on the input terminal has a first polarity, and no signal, when the signal on the input terminal has a second opposite polarity; means for supplying said analog input signal to the input terminal of said first amplifier circuit; for each said additional amplifier circuit an associated threshold circuit with an individually variable threshold value for receiving said analog input signal and supplying to the input terminal of the associated additional amplifier circuit a signal constituting the difference between the value of the analog input signal and the threshold value of said threshold circuit; for each of said additional amplifier circuits an associated signal indicating means for indicating the presence of a signal on the output terminal of said additional amplifier circuit; and signal combining means receiving the signals present on the output terminals of said first and additional amplifier circuits for combining said signals into a combined signal constituting said analog output signal.

2. A device as claimed in claim 1, wherein said analog input signal is supplied directly to the input terminal of said first amplifier circuit.

3. A device as claimed in claim 1, wherein said means for supplying said analog input signal to the input terminal of said first amplifier circuit comprise a threshold circuit with a variable thereshold value for receiving said analog input signal and supplying to the input terminal of said first amplifier circuit a signal consituting the difference between the value of said analog input signal and the threshold value of said threshold circuit, and comprising a signal indicating means associated with said first amplifier circuit for indicating the presence of a signal on the output terminal of said first amplifier circuit.

4. A device as claimed in claim 1, wherein said signal combining means provide a combined signal proportional to the sum of all signals present on the output terminals of said first and additional amplifier circuits.

5. A device as claimed in claim 1, wherein said signal combining means provide a combined signal proportional to the signal present on the output terminal on said first amplifier circuit substracted by any signals present on the output terminals of said additional amplifier circuits.

6. A device as claimed in claim 4, wherein some of said additional amplifier circuits are operative to provide signals on their output terminals having the same polarity as the signal provided on the output terminal of said first amplifier circuit, whereas others of said additional amplifier circuits are operative to provide signals on their output terminals having the opposite polarity relative to the signal provided on the output terminal of said first amplifier circuit.

* * * * *